USOO5750016A

United States Patent [19]
Moon

[11] Patent Number: 5,750,016
[45] Date of Patent: May 12, 1998

[54] PROCESS FOR PLATING PALLADIUM OR PALLADIUM ALLOY ONTO IRON-NICKEL ALLOY SUBSTRATE

[76] Inventor: Sung-Soo Moon, 265-12, Hakjang-dong, Sasang-ku, Pusan, Rep. of Korea, 617-020

[21] Appl. No.: 713,579

[22] Filed: Sep. 13, 1996

[30] Foreign Application Priority Data

| Sep. 16, 1995 | [KR] | Rep. of Korea | 95-30313 |
| Feb. 7, 1996 | [KR] | Rep. of Korea | 96-2912 |
| May 1, 1996 | [KR] | Rep. of Korea | 96-14102 |
| Jun. 14, 1996 | [KR] | Rep. of Korea | 96-21467 |

[51] Int. Cl.$^6$ ............... C25D 5/10; C25D 5/12; B32B 15/01; B41M 5/20
[52] U.S. Cl. ............ 205/50; 205/176; 205/181; 205/182; 428/670; 428/672
[58] Field of Search ............... 205/176, 181, 205/182, 50; 428/670, 672

[56] References Cited

U.S. PATENT DOCUMENTS 5,436,082  7/1995  Mathew ............... 205/181

OTHER PUBLICATIONS

Metals Handbook, 9th ed., vol. 2, ASM, p. 713.

*Primary Examiner*—Kathryn L. Gorgos
*Assistant Examiner*—Edna Wong
*Attorney, Agent, or Firm*—Anderson, Kill & Olick, P.C.

[57] ABSTRACT

A process for electroplating palladium or a palladium alloy onto an iron-nickel alloy substrate, which comprises the steps of: i) electroplating a metal selected from the group consisting of copper, tin, a nickel-tin alloy and a copper-tin alloy onto the substrate to form a first primer layer; ii) electroplating nickel or a gold alloy onto the first primer layer to form a second primer layer; and iii) electroplating palladium or a palladium alloy onto the second primer layer to from a palladium or a palladium alloy electroplating layer.

19 Claims, No Drawings

PROCESS FOR PLATING PALLADIUM OR PALLADIUM ALLOY ONTO IRON-NICKEL ALLOY SUBSTRATE

FIELD OF THE INVENTION

The present invention relates to a process for electroplating palladium or a palladium alloy onto an iron-nickel alloy substrate, and more particularly to a process for electroplating palladium or a palladium alloy onto a semiconductor lead frame made of an iron-nickel alloy.

BACKGROUND OF THE INVENTION

Copper alloys, the traditional materials used in manufacturing lead frames have recently been replaced, at least partly, by iron-nickel alloys which are better suited for highly integrated semiconductor lead frames.

The stamping process employed in the production of copper alloy-based semiconductor lead frames may not be used in producing semiconductor lead frames made of Fe-Ni alloys, because the leads may be easily bent or broken due to the increased hardness of the Fe-Ni alloys as compared with Cu alloys. Therefore, an etching process has been developed for Fe-Ni lead frames.

To achieve desirable properties, e.g. good corrosion resistance and solderability, lead frames made of Fe-Ni alloys are generally subjected to silver electroplating and then to tin-lead alloy electroplating(i.e., soldering) to form relatively thick protective electroplating layers having a thickness in the range of 5–10 μm.

However, as the number of leads increases, as in a high pin lead frame, the space between the leads becomes smaller and plating may fill up the space between the leads, eventually causing them to stick together. To ameliorate such problem, many attempts have been made to develop thin electroplating layers having desirable properties such as excellent corrosion resistance and solderability. One such attempt was to plate palladium or a palladium alloy onto a Fe-Ni frame. However, a conventional palladium electroplating method was unsatisfactory for the reasons stated below:

First, it is not easy to chemically activate a substrate made of iron-nickel alloys, e.g., Alloy #42(Ni 42%, Fe 56%, Mn 0.8%, Si 0.3%, Ca 0.035%, P 0.025%), a typical iron-nickel alloy used in lead frame manufacturing, owing to the Si and Ca components contained therein. Further, when a substrate made of Alloy #42 is plated with a conventional nickel plating composition to deposit a primer layer, the Fe component in Alloy #42 acts to cause deterioration of the adhesiveness between the substrate and the electroplating, resulting in poor corrosion resistance and solderability.

Therefore, there has existed a need to develop a new, effective method for electroplating palladium or a palladium alloy onto an iron-nickel alloy substrate.

SUMMARY OF THE INVENTION

It is, therefore, a primary object of the present invention to provide a method for electroplating palladium or a palladium alloy onto an iron-nickel alloy substrate.

It is a further object of the present invention to provide an article prepared by the above process.

In accordance with the present invention, there is provided a process for electroplating palladium or a palladium alloy onto an iron-nickel alloy substrate, which comprises the steps of: i) electroplating a metal selected from the group consisting of copper, tin, a nickel-tin alloy and a copper-tin alloy onto the substrate to form a first primer layer; ii) electroplating nickel or a gold alloy onto the first primer layer to form a second primer layer; and iii) electroplating palladium or a palladium alloy onto the second primer layer to from a palladium or a palladium alloy electroplating layer.

In accordance with the present invention, there is also provided an article prepared by the above process.

DETAILED DESCRIPTION OF THE INVENTION

The structure of the iron-nickel alloy substrate plated by the process of the present invention is as follows:

| | |
|---|---|
| Top Plating Layer | Pd or Pd alloy |
| Second Primer Plating Layer | Ni or Au alloy |
| First Primer Plating Layer | Cu, Sn, Ni—Sn alloy or Cu—Sn alloy |
| Substrate | Fe—Ni alloy |

The substrate in practicing the present invention may be any of the conventional electronic devices such as lead frames, printed circuit boards and connectors which are made of an iron-nickel alloy; in particular, a lead frame made of Alloy #42 is preferred.

The first primer electroplating layer of the present invention may be formed by electroplating a metal selected from the group consisting of Cu, Sn, Ni-Sn alloys and Cu-Sn alloys.

For forming a copper layer as the first primer electroplating layer of the present invention, any conventional copper plating composition may be used. However, it is preferred that the Cu primer electroplating composition comprises copper in an amount ranging from 20 to 50 g/l in the form of a soluble copper compound other than copper cyanide, e.g., copper sulfate, copper pyrophosphate, copper carbonate and a mixture thereof.

For forming a tin layer as the first primer plating layer of the present invention, any conventional tin plating composition may be used. However, it is preferred that the Sn primer electroplating composition comprises tin in an amount ranging from 5 to 15 g/l in the form of a soluble tin compound.

For forming a Ni-Sn alloy layer as the first primer plating layer of the present invention, any conventional Ni-Sn plating composition may be used. However, it is preferred that the Ni-Sn primer electroplating composition comprises 9 to 15 g/l of tin and 4 to 10 g/l of nickel in the form of soluble tin and nickel compounds.

For forming a Cu-Sn alloy layer as the first primer plating layer of the present invention, any conventional Cu-Sn plating composition may be used. However, it is preferred that the Cu-Sn primer electroplating composition comprises 10 to 30 g/l of copper and 3 to 7 g/l of tin in the form of soluble copper and tin compounds.

The representative substances which can form the second primer electroplating layer of the present invention are nickel and gold alloy. An Au alloy may be selected from the group consisting of Au-Ni, Au-Sn, Au-Co and Au-bismuth alloys.

For forming a nickel layer as the second primer plating layer of the present invention, any conventional nickel plating composition may be used. However, it is preferred that the nickel plating composition comprises 30 to 100 gl of nickel in the form of a soluble nickel compound, e.g., nickel sulfate, nickel chloride, nickel sulfamate, nickel methanesulfonate, nickel acetate, nickel carbonate, nickel hydroxide and a mixture thereof.

For forming an Au-Ni alloy layer as the second primer plating layer of the present invention, any conventional Au-Ni plating composition may be used. However, it is preferred that the Au-Ni primer electroplating composition comprises 2 to 4 g/l of gold and 0.5 to 2 g/l of nickel in the form of soluble compounds.

For forming an Au-Sn alloy layer as the second primer plating layer of the present invention, any conventional Au-Sn plating composition may be used. However, it is preferred that the Au-Sn electroplating composition comprises 2 to 4 g/l of gold and 0.5 to 2 g/l of tin in the form of soluble gold and tin compounds.

For forming an Au-Co alloy layer as the second primer plating layer of the present invention, any conventional Au-Co plating composition may be used. However, it is preferred that the Au-Co electroplating composition comprises 2 to 4 g/l of gold and 1 to 2 g/l of cobalt in the form of soluble gold and cobalt compounds.

For forming a Au-Bi alloy layer as the second primer plating layer of the present invention, any conventional Au-Bi plating composition may be used. However, it is preferred that the Au-Bi electroplating composition comprises 2 to 4 g/l of gold and 0.3 to 0.7 g/l of bismuth in the form of soluble gold and bismuth compounds.

The primer electroplating compositions disclosed above for forming the first and second primer layers of the present invention may further comprise conducting salts, chelating agents, surface modifiers, stress modifier and/or other additives.

The above primer electroplating compositions may be prepared by simply dissolving metal compounds, conducting salts, chelating agent and other additives in water, or by reacting metal compounds with conducting salts and/or chelating agents and then dissolving the mixture in water.

Palladium or a palladium alloy is plated onto the iron-nickel substrate having two primer layers, wherein the palladium alloy is selected from the group consisting of Pd-Au, Pd-Ag and Pd-Bi alloys.

For forming the palladium electroplating layer of the present invention, any conventional palladium electroplating composition may be used. However, it is preferred that the such palladium plating composition may comprise 4 to 10 g/l of palladium in the form of a soluble palladium compound.

Representative palladium compounds which may be used as the palladium source include: tetrachloro diammonium palladium, dichloro tetraammonium palladium, dichlorodiamine palladium, palladium chloride, dichlorotetraamine palladium and a mixture thereof.

For forming the Pd-Au alloy electroplating layer of the present invention, any conventional Pd-Au electroplating composition may be used. However, it is preferred that the Pd-Au alloy plating composition comprises 4 to 10 g/l of palladium and 0.3 to 0.7 g/l of gold in the form of soluble palladium and gold compounds.

For forming the Pd-Ag alloy electroplating layer of the present invention, any conventional Pd-Ag electroplating composition may be used. However, it is preferred that the Pd-Ag plating composition comprises 4 to 10 g/l of palladium and 0.5 to 1.3 g/l of silver in the form of soluble palladium and gold compounds.

For forming the Pd-Bi electroplating layer of the present invention, any conventional Pd-Bi electroplating composition may be used. However, it is preferred that Pd-Bi electroplating composition comprises 4 to 10 g/l of palladium and 0.3 to 0.7 g/l of bismuth in the form of soluble palladium and bismuth compounds.

The process of the present invention may be conducted as follows:

First, an iron-nickel substrate to be plated is immersed together with an anode in a plating composition for the first primer plating layer, and then a current ranging from 2 to 3 ASD(Ampere per Square Decimeter) is applied across the substrate and the anode, while maintaining the temperature of the composition at 25° to 50° C. to deposit on the substrate a first primer electroplating layer having a thickness ranging from 0.7 to 1.0 μm.

Then, the Fe-Ni substrate plated with a first primer plating layer is immersed together with an anode in a plating composition for the second primer plating layer, and then a current ranging from 0.7 to 5.0 ASD is applied across the substrate and the anode, while maintaining the temperature of the composition at 35° to 450° C. to deposit on the first primer layer a second primer plating layer having a thickness ranging from 0.5 to 1.0 μm.

Finally, the iron-nickel substrate having two primer layers is immersed together with an anode in a palladium or palladium alloy plating composition, and then a current ranging from 0.7 to 1.5 ASD is applied across the substrate and the anode, while maintaining the temperature of the composition at 30° to 450° C. to form a palladium or palladium alloy plating layer having a thickness ranging from 0.08 to 0.12 μm.

Although the specific gravity of the plating composition can be varied depending on the plating method, it generally ranges from 4 to 25 Baumé. The pH of the composition is adjusted to a range preferably from 4 to 13.5.

The following Examples are intended to illustrate the present invention more specifically, without limiting the scope of the invention.

In the Examples, the adhesiveness, flexibility, corrosion resistance and solderability were measured in accordance with the following Reference Examples.

Reference Example 1 : Adhesiveness

Each of the lead frames plated in accordance with Examples or Comparative Examples was baked at 400±5° C. for 2 minutes, and then, the appearance of the plated layer of the sample was evaluated with a magnifying glass(20X) or the naked eye, as follows:

i) Blisters, peeling, lifting and bleeding phenomenon should not be observed(o: good; X:poor).

ii) When the area where the flag and the lead of the sample cross was scratched with a sharp material, peeling and lifting phenomenon should not be observed in that area(o: good; X:poor).

iii) A piece of an adhesive tape(3M Scotch Tape: #540, #610 or #810) was attached across the strip of the sample and pressed together firmly with fingers. Then, the tape was removed by a sharp peeling motion. Peeling of the plated layers should not be observed(O: good; X:poor).

Reference Example 2 : Flexibility

Each of the lead frames plated in accordance with Examples or Comparative Examples was baked at 400±5° C. for 2 minutes. Then, the external leads of the sample were bent in one direction at an angle of 90° or more, followed by observing the surface of the sample with a magnifying glass(20X) or the naked eye; peeling or lifting of the plated layer should not be observed(o: good; X:poor).

Reference Example 3 : Corrosion Resistance

Each of the lead frames plated in accordance with Examples or Comparative Examples was sprayed with 5% NaCl solution at 40±5° C. for 24 hours, followed by observing the sample with a magnifying glass(20X) or the naked eye; corrosion marks, blisters and peeling of the plated layer should not be observed(o: good; X:poor).

Reference Example 4 : Solderability

Each of the lead frames plated in accordance with Examples or Comparative Examples was mold-hardened at 175° C. for 3 minutes and then post-hardened at the same temperature for 3 hours. The hardened substrate was heated at 145° C. for 96 hours, steam-aged at 95° C. for 32 hours, and then submerged in a flux(Kester) for 3 seconds. The substrate was then soldered at 260° C. for 3 seconds.

When the soldered part was observed with a magnifying glass(20x) or the naked eye, a uniform Pb coating having no pinholes should cover 95% of the total area of the soldered surface(o: good; X:poor).

In the Examples and Comparative Examples, a varying combination of the following plating compositions was used.

Composition 1:
Pd plating composition (pH 5, Bé 7, 30° C.)

| Ingredients | Amounts |
| --- | --- |
| tetrachloro diammonium palladium | 12 g/l |
| potassium sulfate | 50 g/l |
| nitrilotriacetic acid | 5 g/l |
| naphthalene-1-sulfonic acid(α) sodium salt | 0.1 g/l |
| triethylenetetraamine | 0.007 g/l |

Composition 2:
Pd—Au alloy plating composition (pH 5, Bé 8, 35° C.)

| Ingredients | Amounts |
| --- | --- |
| dichloro tetraammonium palladium | 10 g/l |
| potassium gold(I) cyanide | 0.74 g/l |
| ammonium phosphate | 50 g/l |
| 4-oxo-pentanoic acid(9CI) | 2 g/l |
| benzene sulfonate | 0.1 g/l |

Composition 3:
Pd—Ag alloy plating composition (pH 9.5, Bé 8, 45° C.)

| Ingredients | Amounts |
| --- | --- |
| dichlorodiamine palladium | 11 g/l |
| silver o-phosphate | 2 g/l |
| potassium pyrophosphate | 60 g/l |
| sodium pyrophosphate | 20 g/l |
| aminoacetic acid | 3 g/l |
| sodium 2-propene-1-sulfonate | 0.15 g/l |
| polyethyleneimine | 0.07 g/l |

Composition 4:
Pd—Bi alloy plating composition (pH 6.5, Bé 7, 40° C.)

| Ingredients | Amounts |
| --- | --- |
| dichlorotetraamine palladium | 10 g/l |
| sodium bismuth·hydrate | 2 g/l |
| ammonium chloride | 50 g/l |
| ammonium sulfate | 35 g/l |
| 1-phenyl semicarbazide | 0.5 g/l |
| 4-methoxy benzaldehyde | 0.2 g/l |
| polyethyleneimine | 0.07 g/l |

Composition 5:
Cu plating composition (pH 8, Bé 8, 50° C.)

| Ingredients | Amounts |
| --- | --- |
| copper sulfate·5 hydrate | 50 g/l |
| ammonium sulfate | 45 g/l |
| potassium sulfate | 20 g/l |
| ethylenediaminetetraacetate·2 hydrate | 5 g/l |
| sodium tetraphenylborate | 0.5 g/l |
| diethylene glycol monodecylether | 0.1 g/l |

Composition 6:
Sn plating composition (pH 7, Bé 6, 25° C.)

| Ingredients | Amounts |
| --- | --- |
| tin methanesulfonate | 40 g/l |
| methanesulfonic acid | 210 g/l |
| N-butylidenesulfanilic acid | 5 g/l |
| catechol | 1 g/l |
| benzaldehyde | 0.05 g/l |
| resorcinol | 0.02 g/l |

Composition 7:
Ni—Sn alloy plating composition (pH 2.5, Bé 9, 25° C.)

| Ingredients | Amounts |
| --- | --- |
| nickel sulfamate | 80 g/l |
| tin chloride·2 hydrate | 20 g/l |
| m-sulfonic acid | 60 g/l |
| gluconic acid | 5 g/l |
| N,N-diethyl-1,3-diaminopropane | 0.08 g/l |
| triethanolamine laurylsulfate | 0.02 g/l |

Composition 8:
Cu—Sn alloy plating composition (pH 13.5, Bé 11, 50° C.)

| Ingredients | Amounts |
| --- | --- |
| copper pyrophosphate | 50 g/l |
| potassium stannate | 12 g/l |
| potassium carbonate | 60 g/l |
| sodium carbonate | 35 g/l |
| potassium hydroxide | 5 g/l |
| nitrilotriacetic acid | 3 g/l |
| (±)-1-(1-naphthyl)methylamine | 0.5 g/l |
| polyethyleneimine | 0.07 g/l |

Composition 9:
Ni plating composition (pH 5, Bé 25, 45° C.)

| Ingredients | Amounts |
| --- | --- |
| nickel sulfamate | 450 g/l |
| ammonium sulfate | 90 g/l |
| sodium borate | 50 g/l |
| aminoacetic acid | 5 g/l |
| 2-methoxy-1-naphthaldehyde | 0.3 g/l |
| tridecyloxypoly(ethyleneoxy)ethanol(III) | 0.1 g/l |

Composition 10:
Au—Ni alloy plating composition (pH 6.5, Bé 4, 35° C.)

| Ingredients | Amounts |
| --- | --- |
| potassium gold(III) tetrachloride | 5.9 g/l |
| nickel chloride | 4 g/l |
| ammonium chloride | 45 g/l |
| aminoacetic acid | 7 g/l |
| sodium potassium tartrate | 5 g/l |
| N,N'-(1,2-phenylene)dimaleimide | 0.5 g/l |
| β-naphtholethoxylate | 0.01 g/l |

Composition 11:
Au—Sn alloy plating composition (pH 4.5, Bé 4.6, 35° C.)

| Ingredients | Amounts |
| --- | --- |
| potassium gold(III) tetrachloride | 5.9 g/l |
| tin chloride·2 hydrate | 3 g/l |
| potassium citrate | 50 g/l |
| citric acid | 20 g/l |
| sodium potassium tartrate | 5 g/l |
| benzaldehyde tristyrylpenilic acid | 0.3 g/l |
| Triethanolamine laurylsulfate | 0.02 g/l |

Composition 12:
Au—Co alloy plating composition (pH 8.5, Bé 4, 35° C.)

| Ingredients | Amounts |
| --- | --- |
| potassium gold(III) tetrachloride | 5.9 g/l |
| cobalt chloride·6 hydrate | 4 g/l |
| ammonium dihydrogen phosphate | 30 g/l |
| diammonium hydrogen phosphate | 25 g/l |
| aminoacetic acid | 5 g/l |
| nitrilotriacetic acid | 3 g/l |
| N,N,N',N'-tetrakis(2-hydroxypropyl) ethylenediamine | 0.1 g/l |
| polyethyleneimine | 0.05 g/l |

Composition 13:
Au—Bi alloy plating composition (pH 4.5, Bé 5.5, 40° C.)

| Ingredients | Amounts |
| --- | --- |
| potassium gold(III) tetrachloride | 5.9 g/l |
| sodium bismuth hydrate | 2 g/l |
| ammonium sulfate | 60 g/l |
| 1-phenylsemicarbazide | 1 g/l |
| N-arylpyridium chloride | 0.3 g/l |
| polyethyleneimine | 0.05 g/l |

EXAMPLE 1

A Fe-Ni alloy a Fe-Ni alloy containing 42% of Ni, 56% of Fe, 0.8% of Mn, 0.3% of Si, 0.035% of Ca and 0.025% of P lead frame for mounting a semiconductor chip (Motorola) was plated with 1 l of Composition 5 at a current of 3 ASD to give a first primer plating layer of copper. Then, the resulting substrate was plated with 1 l of Composition 9 at a current of 0.7 ASD to give a second primer plating layer of nickel. Finally, the substrate thus obtained was plated with 1 l of one of the Compositions 1 to 4 at a current of 1.0 ASD to provide Fe-Ni substrates having 2 primer layers and uniform light grey plating layer of palladium, Pd-Au(95:5), Pd-Ag(97:3) and Pd-Bi(98:2), respectively, of the present invention.

The adhesiveness, flexibility, corrosion resistance and solderability of the final lead frame were evaluated in accordance with the above Reference Examples and the results are shown in Table I.

As shown in Table I, the properties of the lead frames prepared in accordance with the Example 1 are excellent.

EXAMPLES 2 to 20

The procedure of Example 1 was repeated except that the primer plating compositions and conditions for primer plating were varied as shown in Table I to provide Fe-Ni substrates having 2 primer layers and a uniform light grey plating layer of palladium, Pd-Au, Pd-Ag and Pd-Bi, respectively, of the present invention.

The adhesiveness, flexibility, corrosion resistance and solderability of the final lead frame were evaluated in accordance with the above Reference Examples and the results are shown in Table I.

As shown in Table I, the properties of the lead frames prepared in accordance with the Examples 2 to 20 are excellent.

COMPARATIVE EXAMPLES 1 to 10

The procedure of Example 1 was repeated except that the primer plating compositions and conditions for primer plating were varied as shown in Table II to provide a Fe-Ni substrate having no or only one primer layer and a plating layer of palladium, Pd-Au, Pd-Ag and Pd-Bi, respectively.

The adhesiveness, flexibility, corrosion resistance and solderability of the final lead frame were evaluated in accordance with the above Reference Examples and the results are shown in Table II.

As shown in Table II, the properties of the lead frames prepared in accordance with the Comparative Examples 1 to 10 are inferior.

TABLE I

| Ex. No. | Primer Plating Composition No. (Current/ASD) | | Properties | | | | | |
| --- | --- | --- | --- | --- | --- | --- | --- | --- |
| | 1st | 2nd | i | ii | iii | (A) | (B) | (C) |
| 1 | 5 (3) | 9 (0.7) | o | o | o | o | o | o |
| 2 | 5 (3) | 10 (0.7) | o | o | o | o | o | o |
| 3 | 5 (3) | 11 (0.7) | o | o | o | o | o | o |
| 4 | 5 (3) | 12 (1.0) | o | o | o | o | o | o |
| 5 | 5 (3) | 13 (1.0) | o | o | o | o | o | o |
| 6 | 6 (2) | 9 (0.7) | o | o | o | o | o | o |
| 7 | 6 (2) | 10 (0.7) | o | o | o | o | o | o |
| 8 | 6 (2) | 11 (0.7) | o | o | o | o | o | o |
| 9 | 6 (2) | 12 (1.0) | o | o | o | o | o | o |
| 10 | 6 (2) | 13 (1.0) | o | o | o | o | o | o |

TABLE I-continued

| Ex. No. | Primer Plating Composition No. (Current/ASD) | | Properties | | | | | |
|---|---|---|---|---|---|---|---|---|
| | 1st | 2nd | Adhesiveness | | | | | |
| | | | i | ii | iii | (A) | (B) | (C) |
| 11 | 7 (2) | 9 (0.7) | o | o | o | o | o | o |
| 12 | 7 (2) | 10 (0.7) | o | o | o | o | o | o |
| 13 | 7 (2) | 11 (0.7) | o | o | o | o | o | o |
| 14 | 7 (2) | 12 (1.0) | o | o | o | o | o | o |
| 15 | 7 (2) | 13 (1.0) | o | o | o | o | o | o |
| 16 | 8 (2) | 9 (0.7) | o | o | o | o | o | o |
| 17 | 8 (2) | 10 (0.7) | o | o | o | o | o | o |
| 18 | 8 (2) | 11 (0.7) | o | o | o | o | o | o |
| 19 | 8 (2) | 12 (1.0) | o | o | o | o | o | o |
| 20 | 8 (2) | 13 (1.0) | o | o | o | o | o | o |

(A) Flexibility
(B) Corrosion Resistance
(C) Solderability
o: good
X: poor

TABLE II

| Comp. Ex. No. | Primer Plating Composition No. (Current/ASD) | Properties | | | | | |
|---|---|---|---|---|---|---|---|
| | | Adhesiveness | | | | | |
| | | i | ii | iii | (A) | (B) | (C) |
| 1 | — | X | X | X | X | X | X |
| 2 | 5 (3) | X | X | X | X | X | X |
| 3 | 6 (2) | X | X | X | X | X | X |
| 4 | 7 (2) | X | X | X | X | X | X |
| 5 | 8 (2) | X | X | X | X | X | X |
| 6 | 9 (2) | X | X | X | X | X | X |
| 7 | 10 (2) | X | X | X | X | X | X |
| 8 | 11 (2) | X | X | X | X | X | X |
| 9 | 12 (2) | X | X | X | X | X | X |
| 10 | 13 (2) | X | X | X | X | X | X |

(A) Flexibility
(B) Corrosion Resistance
(C) Solderability
o: good
X: poor

As shown in the Tables I and II, the lead frames having two primer plating layers have superior adhesiveness, flexibility, corrosion resistance and solderability over those having only one or no primer plating layer.

Further, while the thickness of the conventional platings, i.e., platings consisting of silver plating and then Sn-Pb soldering, ranges from 5 to 10 μm, the total thickness of the three plating layers of the present invention does not exceed 2μm. Accordingly, the process of the present invention can be successfully applied to a high pin lead frame produced by an etching process.

While the invention has been described with respect to the specific embodiments, it should be recognized that various modifications and changes may be made by those skilled in the art to the invention which also fall within the scope of the invention as defined by the appended claims.

What is claimed is:

1. A process for plating palladium or a palladium alloy onto an iron-nickel alloy substrate, which comprises the steps of: i) plating a metal selected from the group consisting of copper, tin, a nickel-tin alloy and a copper-tin alloy onto the substrate to form a first primer layer; ii) plating nickel or a gold alloy onto the first primer layer to form a second primer layer; and iii) plating palladium or a palladium alloy onto the second primer layer to form a palladium or a palladium alloy layer.

2. The process of claim 1, wherein the iron-nickel substrate is a semiconductor lead frame.

3. The process of claim 1, wherein the iron-nickel substrate is a semiconductor lead frame made of a Fe-Ni alloy containing 42% of Ni, 56% of Fe, 0.8% of Mn, 0.3% of Si, 0.035% of Ca and 0.025% of P.

4. The process of claim 1, wherein the gold alloy is selected from the group consisting of gold-nickel, gold-tin, gold-cobalt and gold-bismuth alloys.

5. The process of claim 4, wherein the second primer layer is formed by using a gold-nickel alloy plating composition containing 2 to 4 g/l of gold and 0.5 to 2 g/l of nickel in the form of soluble gold and nickel compounds.

6. The process of claim 4, wherein the second primer layer is formed by using a gold-tin alloy plating composition containing 2 to 4 g/l of gold and 0.5 to 2 g/l of tin in the form of soluble gold and tin compounds.

7. The process of claim 4, wherein the second primer layer is formed by using a gold-cobalt alloy plating composition containing 2 to 4 g/l of gold and 1 to 2 g/l of cobalt in the form of soluble gold and cobalt compounds.

8. The process of claim 4, wherein the second primer layer is formed by using a gold-bismuth alloy plating composition containing 2 to 4 g/l of gold and 0.3 to 0.7 g/l of bismuth in the form of soluble gold and bismuth compounds.

9. The process of claim 1, wherein the palladium alloy is selected from the group consisting of palladium-gold, palladium-silver and palladium-bismuth alloys.

10. The process of claim 9, wherein the palladium-gold alloy plating layer is formed by using a palladium-gold alloy plating composition containing 4 to 10 g/l of palladium and 0.3 to 0.7 g/l of gold in the form of soluble palladium and gold compounds.

11. The process of claim 9, wherein the palladium-silver alloy plating layer is formed by using a palladium-silver alloy plating composition containing 4 to 10 g/l of palladium and 0.5 to 1.3 g/l of silver in the form of soluble palladium and silver compounds.

12. The process of claim 9, wherein the palladium-bismuth alloy plating layer is formed by using a palladium-bismuth alloy plating composition containing 4 to 10 g/l of palladium and 0.3 to 0.9 g/l of bismuth in the form of soluble palladium and bismuth compounds.

13. The process of claim 1, wherein the first primer layer is formed by using a copper plating composition containing copper in an amount ranging from 20 to 50 g/l in the form of a soluble copper compound other than copper cyanide.

14. The process of claim 1, wherein the first primer layer is formed by using a tin plating composition containing tin in an amount ranging from 5 to 15 g/l in the form of a soluble tin compound.

15. The process of claim 1, wherein the first primer layer is formed by using a nickel-tin alloy plating composition containing 9 to 15 g/l of tin and 4 to 10 g/l of nickel in the form of soluble tin and nickel compounds.

16. The process of claim 1, wherein the first primer layer is formed by using a copper-tin alloy plating composition containing 10 to 30 g/l of copper and 3 to 7 g/l of tin in the form of soluble copper and tin compounds.

17. The process of claim 1, wherein the second primer layer is formed by using a nickel plating composition containing 30 to 100 g/l of nickel in the form of a soluble nickel compound.

18. The process of claim 1, wherein the palladium plating layer is formed by using an aqueous palladium plating composition containing 4 to 10 g/l of palladium in the form of a soluble palladium compound.

19. A semiconductor lead frame prepared by the process of any one of claims 1 to 18.

* * * * *